United States Patent
Konrath et al.

(10) Patent No.: US 9,425,327 B2
(45) Date of Patent: Aug. 23, 2016

(54) JUNCTION FIELD EFFECT TRANSISTOR CELL WITH LATERAL CHANNEL REGION

(71) Applicant: Infineon Technologies AG, Neubiberg (DE)

(72) Inventors: Jens Peter Konrath, Villach (AT); Hans-Joachim Schulze, Taufkirchen (DE)

(73) Assignee: Infineon Technologies AG, Neubiberg (DE)

( * ) Notice: Subject to any disclaimer, the term of this patent is extended or adjusted under 35 U.S.C. 154(b) by 54 days.

(21) Appl. No.: 14/083,023

(22) Filed: Nov. 18, 2013

(65) Prior Publication Data

US 2015/0137143 A1    May 21, 2015

(51) Int. Cl.

| | |
|---|---|
| *H01L 29/10* | (2006.01) |
| *H01L 29/808* | (2006.01) |
| *H01L 29/66* | (2006.01) |
| *H01L 21/266* | (2006.01) |
| *H01L 21/04* | (2006.01) |
| *H01L 29/16* | (2006.01) |
| *H01L 21/265* | (2006.01) |
| *H01L 29/20* | (2006.01) |

(52) U.S. Cl.
CPC ........ *H01L 29/8083* (2013.01); *H01L 21/0465* (2013.01); *H01L 21/266* (2013.01); *H01L 29/1058* (2013.01); *H01L 29/1066* (2013.01); *H01L 29/66909* (2013.01); *H01L 21/26546* (2013.01); *H01L 29/1608* (2013.01); *H01L 29/2003* (2013.01)

(58) Field of Classification Search
None
See application file for complete search history.

(56) References Cited

U.S. PATENT DOCUMENTS

| | | | |
|---|---|---|---|
| 2002/0167011 A1* | 11/2002 | Kumar et al. | 257/77 |
| 2005/0173726 A1 | 8/2005 | Potts | |
| 2005/0230715 A1 | 10/2005 | Hoshino et al. | |
| 2006/0255373 A1 | 11/2006 | Elpelt et al. | |
| 2008/0012026 A1 | 1/2008 | Tsuji | |
| 2011/0101501 A1* | 5/2011 | Schulze | 257/611 |
| 2011/0156223 A1* | 6/2011 | Camillo-Castillo et al. | 257/649 |

FOREIGN PATENT DOCUMENTS

JP        2000269518 A        9/2000

* cited by examiner

*Primary Examiner* — Charles Garber
*Assistant Examiner* — Alia Sabur
(74) *Attorney, Agent, or Firm* — Murphy, Bilak & Homiller, PLLC

(57) ABSTRACT

A junction field effect transistor cell of a semiconductor device includes a top gate region, a lateral channel region and a buried gate region arranged along a vertical direction. The lateral channel region includes first zones of a first conductivity type and second zones of a second conductivity type which alternate along a lateral direction perpendicular to the vertical direction. A pinch-off voltage of the junction field effect transistor cell does not depend, or only to a low degree depends, on a vertical extension of the lateral channel region.

18 Claims, 12 Drawing Sheets

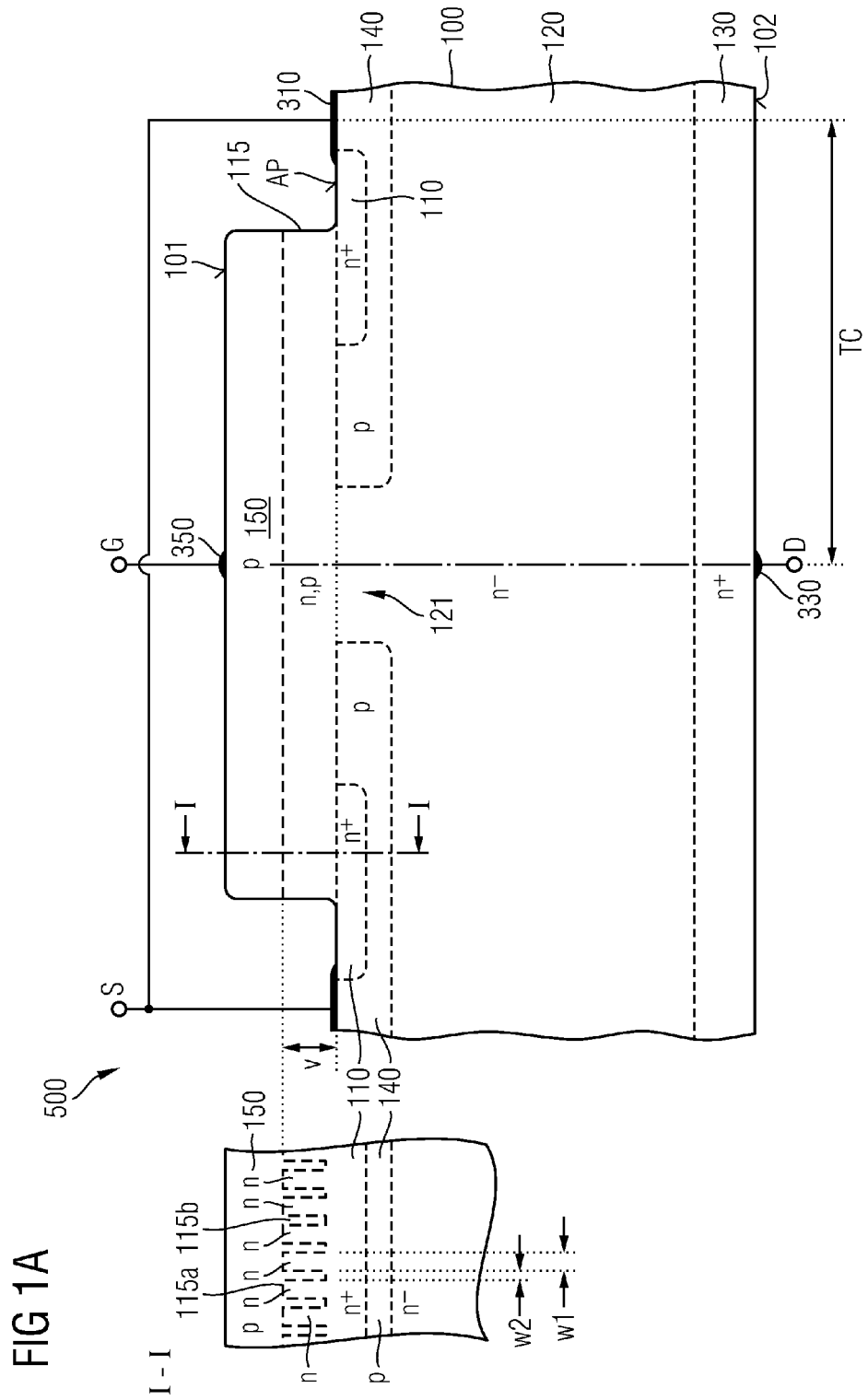

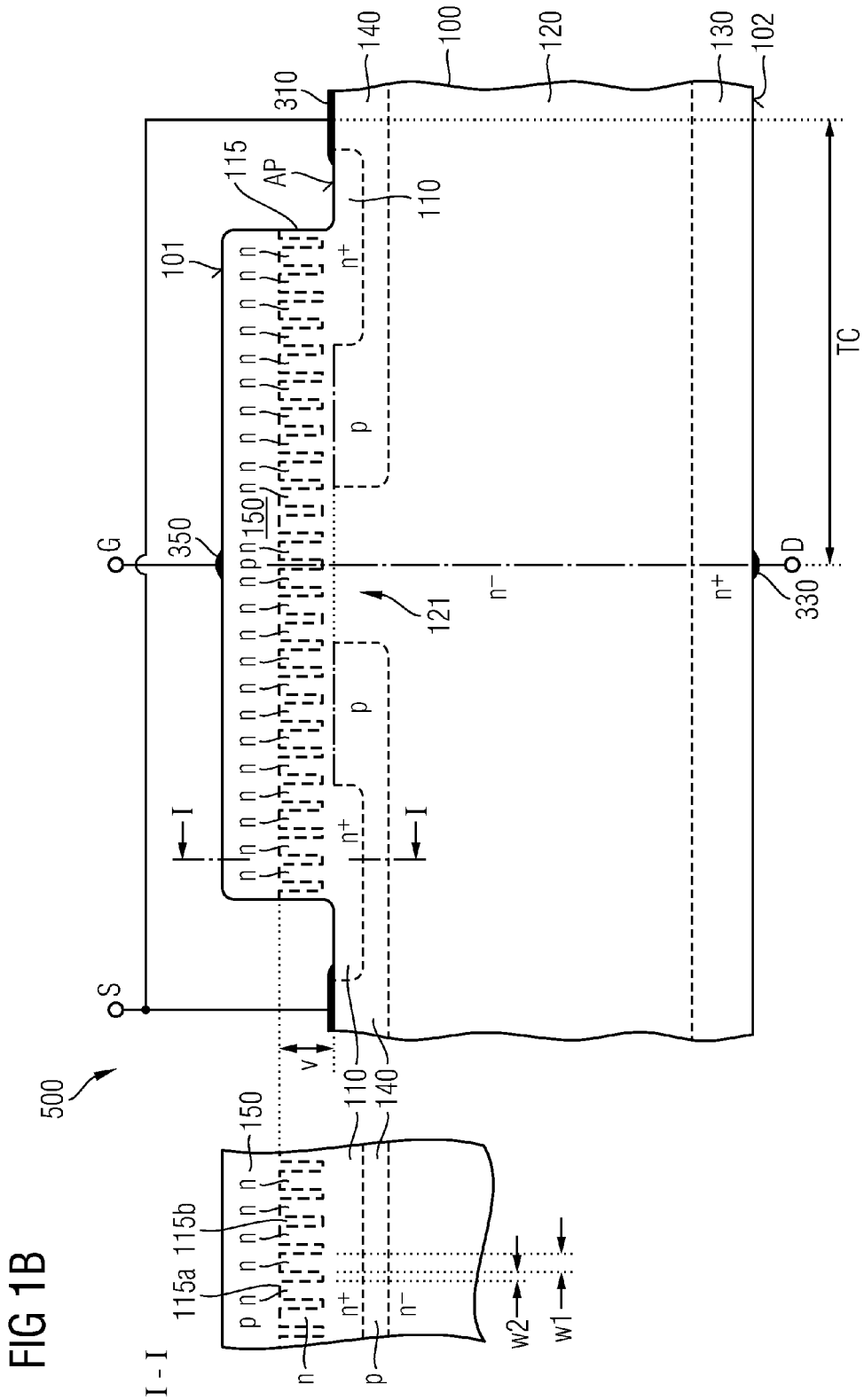

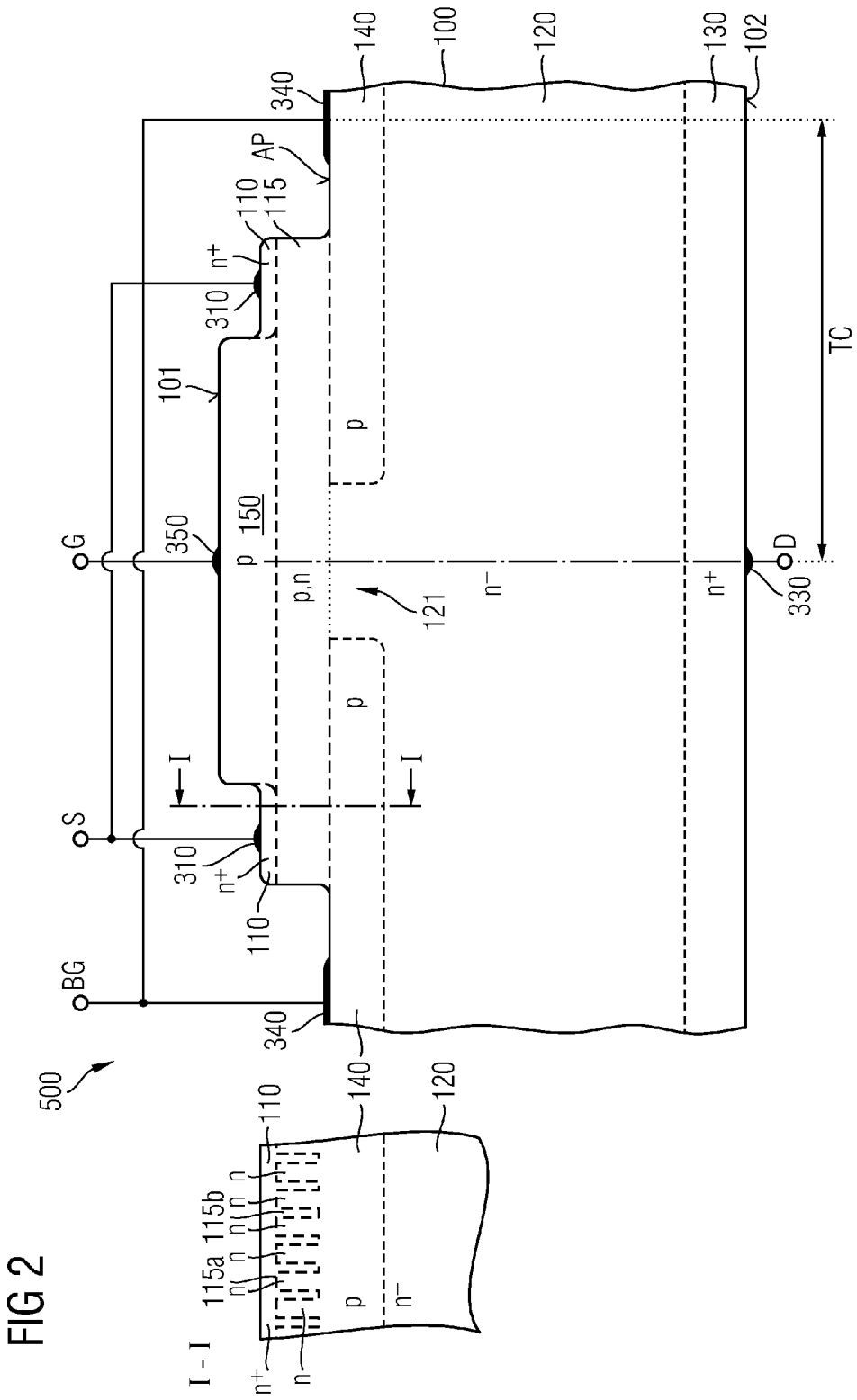

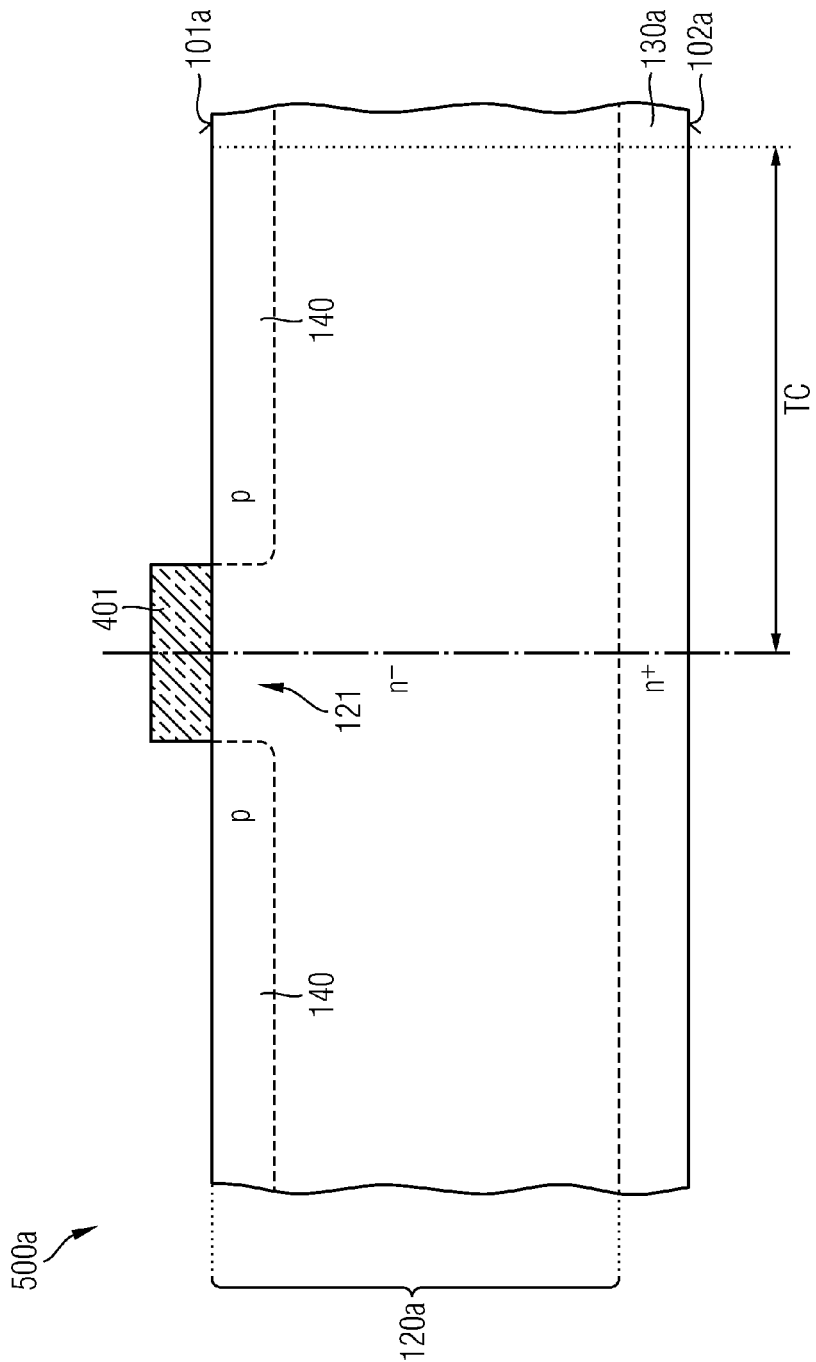

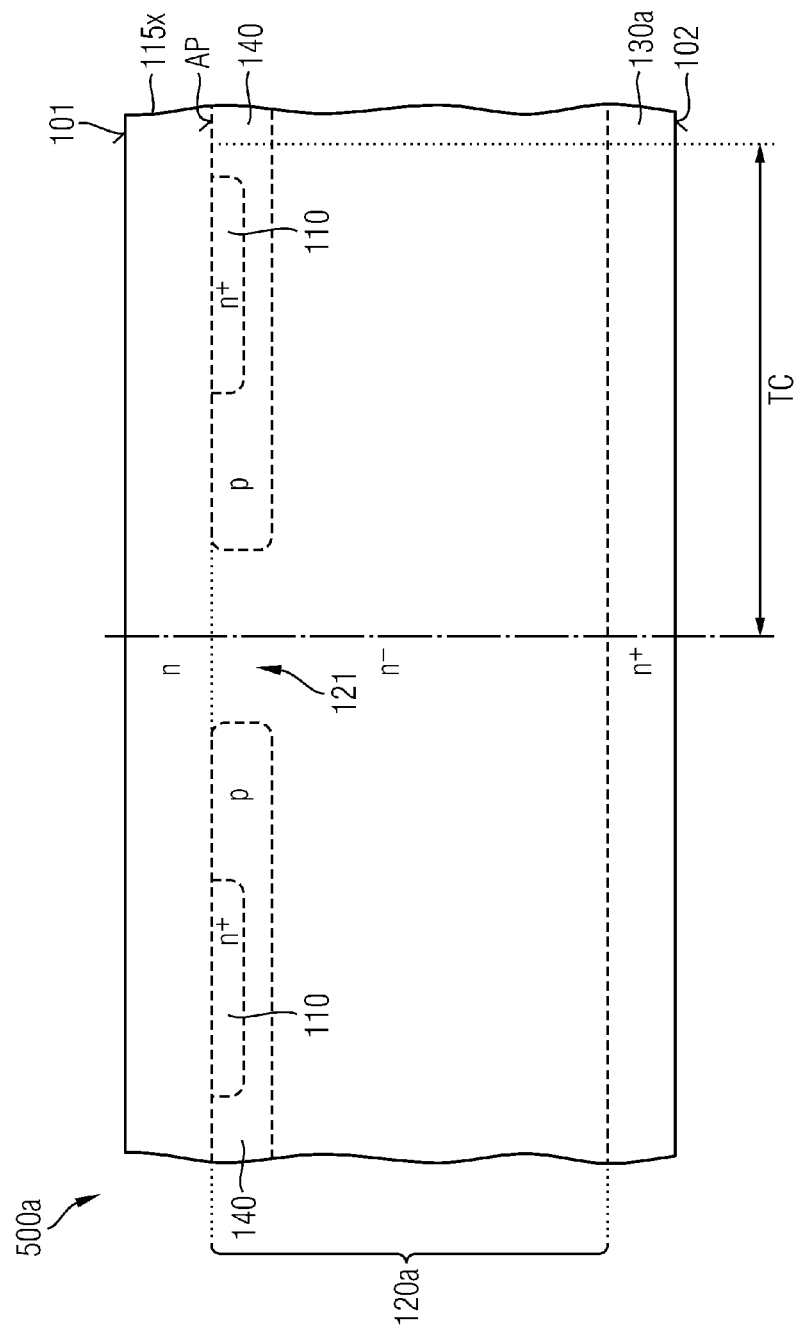

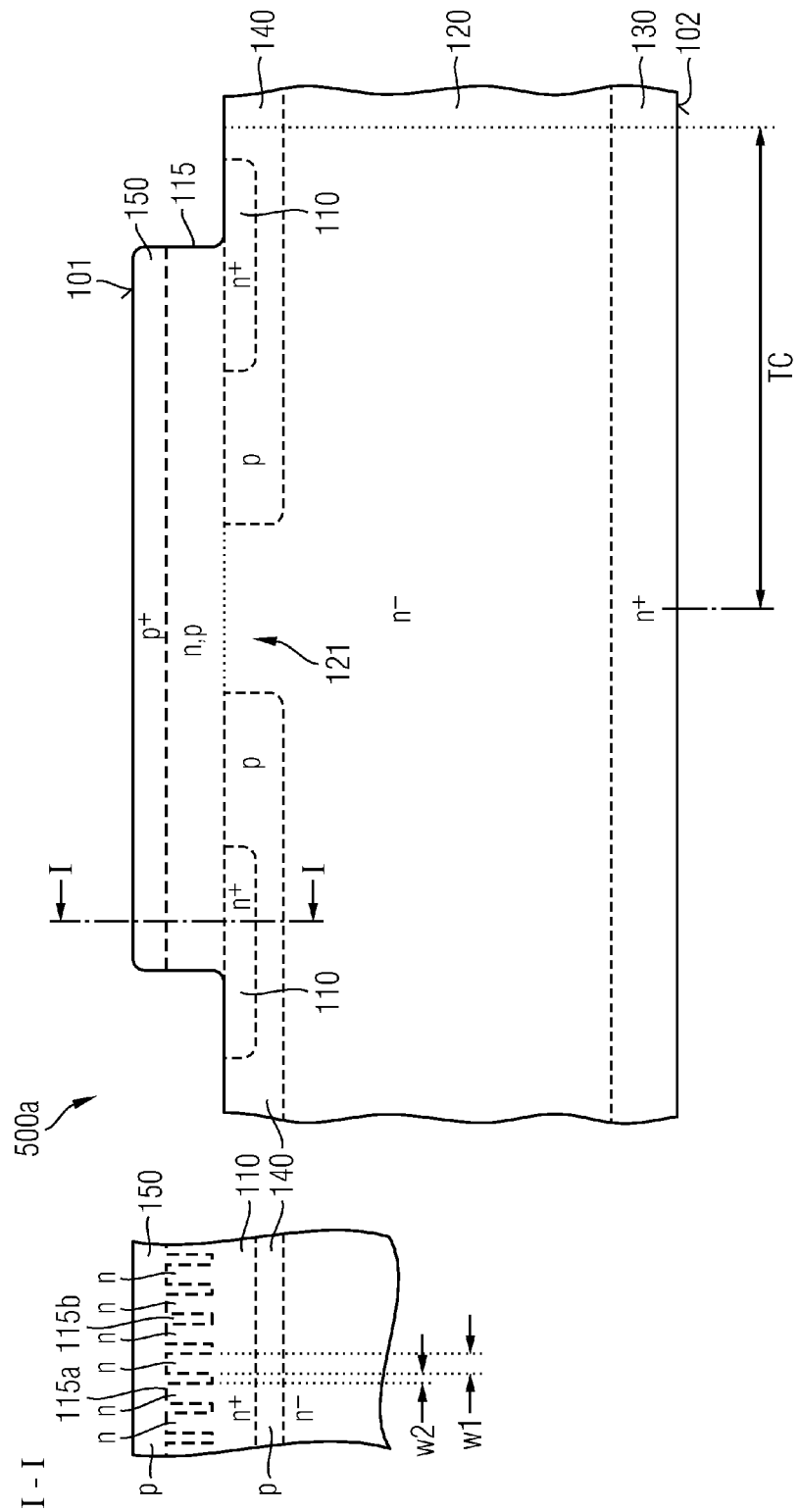

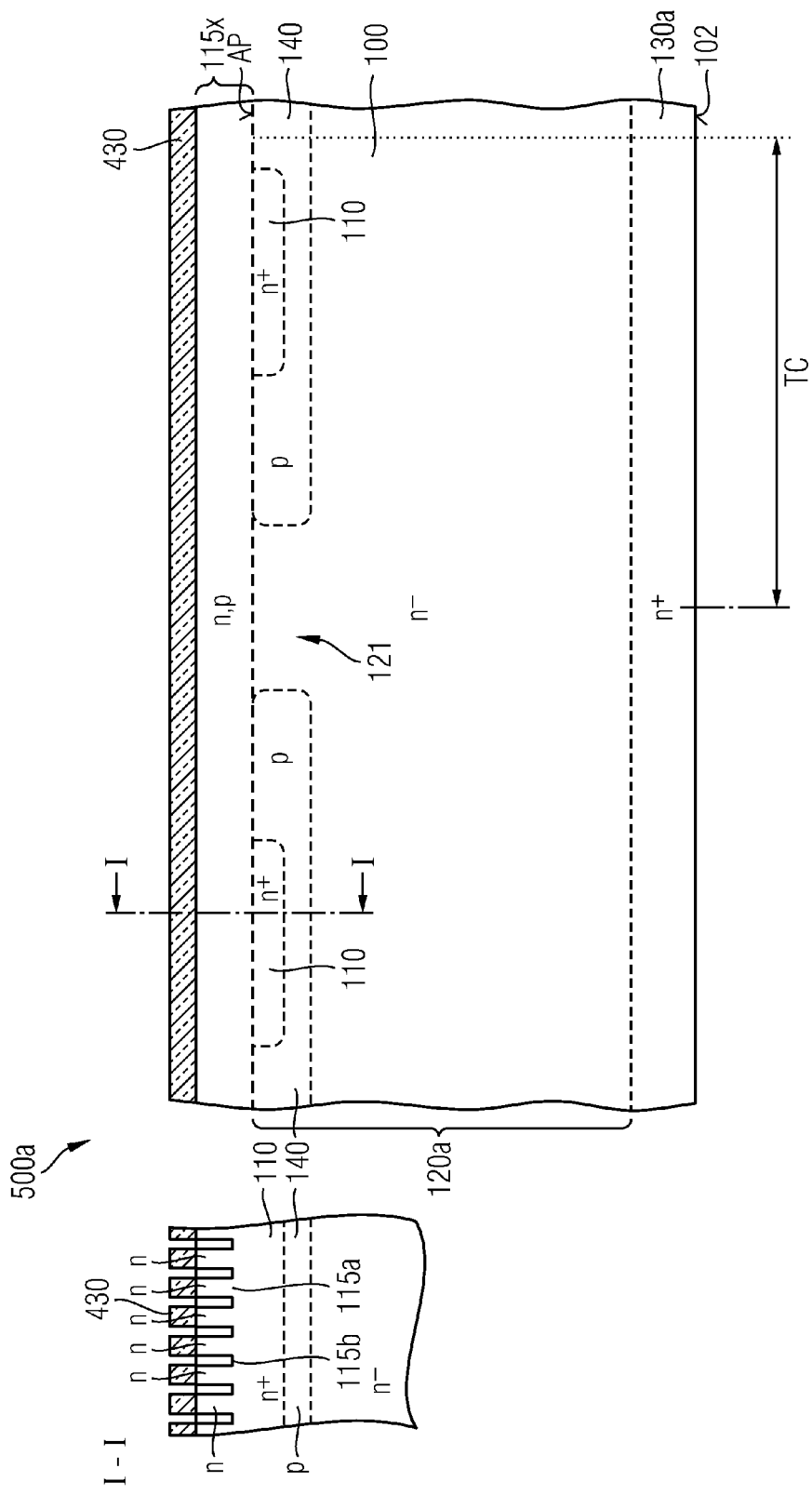

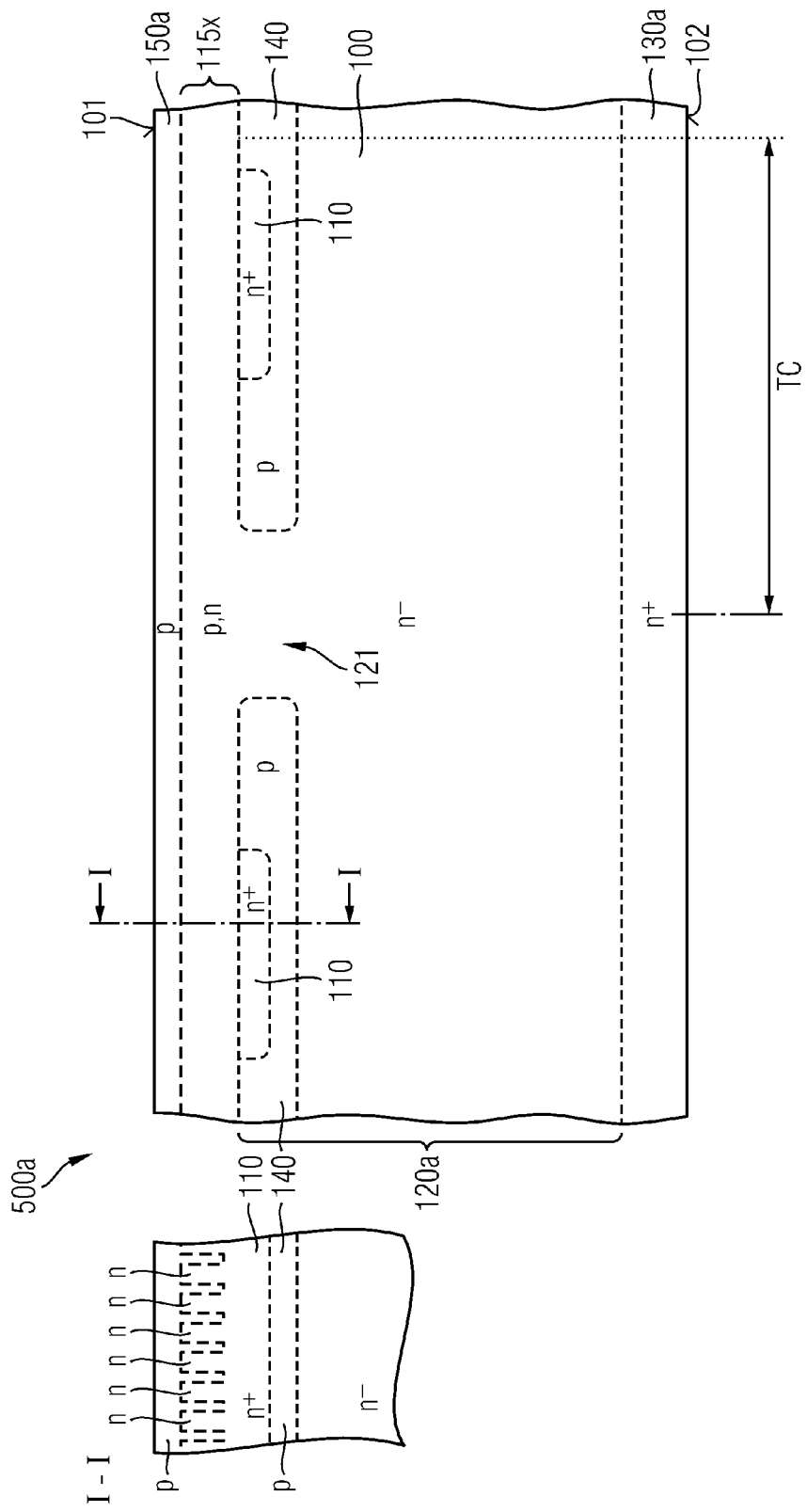

JUNCTION FIELD EFFECT TRANSISTOR CELL WITH LATERAL CHANNEL REGION

BACKGROUND

In conventional JFETs (junction field effect transistors) the extension of a depletion region of a reverse-biased pn-junction modulates the cross-sectional area of a channel region through which a load current of the JFET passes. Minority charge carrier storage effects influence the operation of JFETs only to a low degree such that JFETs can be used inter alia in high speed applications. It is desirable to provide JFETs with improved device characteristics.

SUMMARY

An embodiment refers to a semiconductor device including a junction field effect transistor cell. The junction field effect transistor cell includes a top gate region, a lateral channel region and a buried gate region arranged along a vertical direction. The lateral channel region includes first zones of a first conductivity type and second zones of a second, opposite conductivity type that alternate along a lateral direction perpendicular to the vertical direction.

Another embodiment refers to a junction field effect transistor. The junction field effect transistor includes a top gate region, a lateral channel region and a buried gate region arranged along a vertical direction. The lateral channel region includes first zones of a first conductivity type and second zones of a second conductivity type, wherein the first and second zones alternate along a lateral direction perpendicular to the vertical direction.

A further embodiment refers to a method of manufacturing a semiconductor device. At least one buried gate region of a second conductivity type is formed in a first section of a process surface of a first epitaxial layer of a first conductivity type. A channel layer is formed on the process surface. In the channel layer first zones of a first conductivity type and second zones of a second conductivity type are formed that extend from a surface of the channel layer into the channel layer, respectively. A top gate region is formed that directly adjoins the first and second zones.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

FIG. 1A is a schematic cross-sectional view of a portion of a semiconductor device including a JFET cell according to an embodiment providing a lateral channel region patterned along one lateral axis as well as source regions buried below a lateral channel region.

FIG. 1B is a schematic cross-sectional view of a portion of a semiconductor device including a JFET cell according to an embodiment providing a lateral channel region patterned along two lateral axes as well as source regions buried below a lateral channel region.

FIG. 2 is a schematic cross-sectional view of a portion of a semiconductor device including a JFET cell in accordance with an embodiment providing source zones above a lateral channel region.

FIG. 3A is a schematic cross-sectional view of a portion of a semiconductor substrate for illustrating an embodiment of a method of manufacturing a semiconductor device with a JFET cell including a lateral channel region with a super junction structure after forming buried gate structures.

FIG. 3C is a schematic cross-sectional view of the semiconductor substrate portion of FIG. 3B after growing a channel layer.

FIG. 3F is a schematic cross-sectional view of the semiconductor substrate portion of FIG. 3E after forming the top gate region and exposing the source and buried gate regions.

FIG. 4B is a schematic cross-sectional view of the semiconductor substrate portion of FIG. 4A after forming cavities in the channel layer.

FIG. 4C is a schematic cross-sectional view of the semiconductor substrate portion of FIG. 4B after providing a top gate region and p-type zones of the super junction structure in the channel layer.

DETAILED DESCRIPTION

Figure 3B:
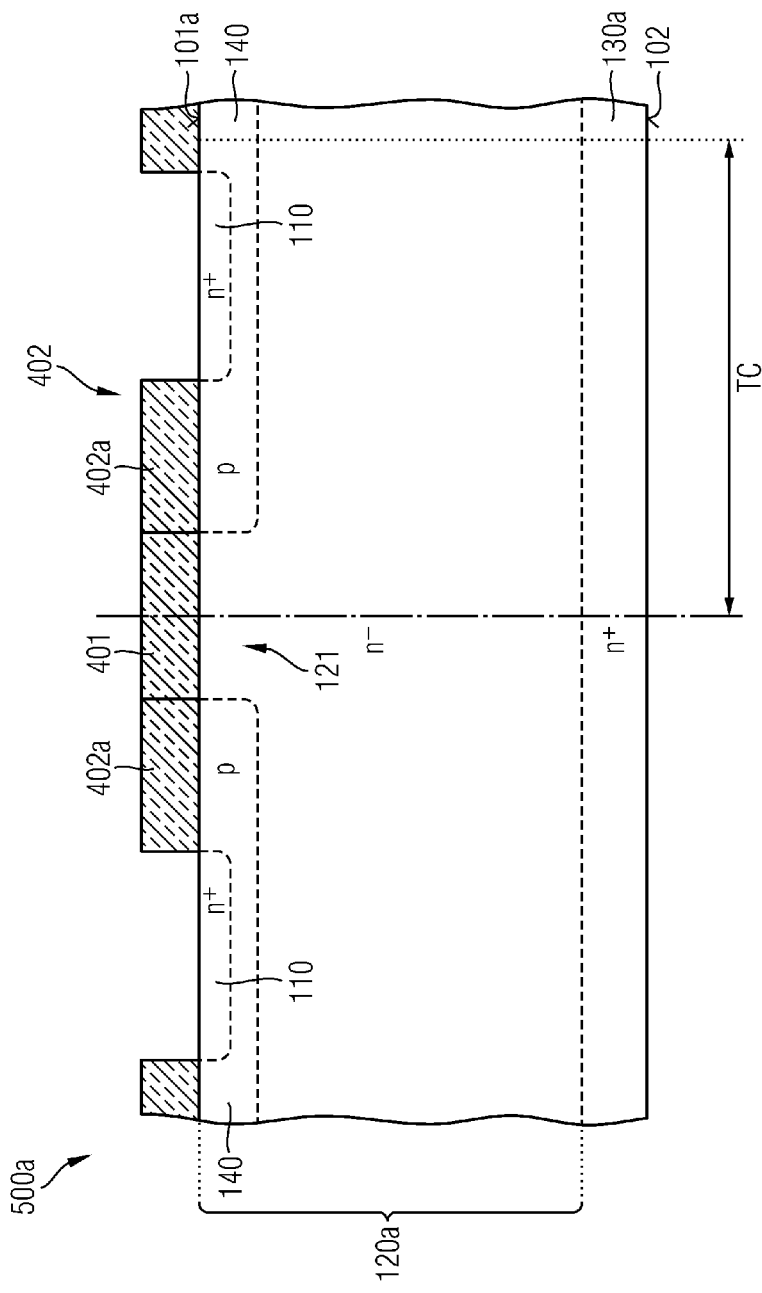
FIG. 3B is a schematic cross-sectional view of the semiconductor substrate portion of FIG. 3A after forming source regions.

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled"

includes that one or more intervening element(s) adapted for signal transmission may be provided between the electrically coupled elements, for example elements that are controllable to temporarily provide a low-ohmic connection in a first state and a high-ohmic electric decoupling in a second state.

The Figures illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

FIG. 1A refers to a semiconductor device 500 including at least one JFET cell TC. The semiconductor device 500 may be a JFET with a plurality of JFET cells TC and source, gate and drain terminals S, G, D or a device including further semiconductor elements in addition to one or more of the JFET cells TC.

The semiconductor device 500 is based on a semiconductor body 100 made of a single-crystalline semiconductor material having a band gap of 2.0 eV or higher, such as gallium nitride GaN or silicon carbide SiC. For example, the single-crystalline semiconductor material is silicon carbide SiC, for example 2H—SiC (SiC of the 2H polytype), 4H—SiC, 6H—SiC or 15R—SiC, by way of example.

The semiconductor body 100 has a first surface 101, which may be approximately planar or which may be given by a plane spanned by coplanar surface sections as well as a mainly planar second surface 102 parallel to the first surface 101. A normal to the first surface 101 defines a vertical direction and directions orthogonal to the vertical direction are lateral directions.

The semiconductor body 100 includes a drift zone 120 and a drain layer 130 of a first conductivity type, respectively. The drain layer 130 directly adjoins the second surface 102 and separates the drift zone 120 from the second surface 102. A mean net impurity concentration in the drain layer 130 exceeds at least ten times the mean net impurity concentration in the drift zone 120. The drift zone 120 may be formed in an epitaxial layer whose crystal lattice is grown in registry with the crystal lattice of the drain layer 130. The drift zone 120 may be in-situ doped and may have a uniform impurity distribution or an impurity concentration gradually or in steps increasing or decreasing with increasing distance to the first surface 101.

One or two buried gate regions 140 of a second conductivity type, which is complementary to the first conductivity type, directly adjoin the drift zone 120 at a side of the drift zone 120 opposite to the drain layer 130. Interfaces between the buried gate regions 140 and the drift zone 120 may be coplanar and parallel to the first and second surfaces 101, 102.

The buried gate regions 140 may be wells formed by masked implants into the epitaxial layer providing the drift zone 120, wherein the wells extend from an auxiliary plane AP, which is parallel to the first and second surfaces 101, 102, into the direction of the second surface 102.

A remaining portion of the drift zone 120 along the auxiliary plane AP forms a vertical channel region 121 extending between the auxiliary plane AP and a main portion of the drift zone 120 below the buried gate electrodes 140. The drift zone 120 with the vertical channel region 121 includes the original in-situ impurity distribution of the grown epitaxial layer.

A top gate region 150 in the semiconductor body 100 has the second conductivity type and directly adjoins the first surface 101. A lateral channel region 115 is sandwiched between the top gate region 150 on the one hand and the auxiliary plane AP on the other hand. The lateral channel region 115 as well as the top gate region 150 may be formed in one or more epitaxial layers grown on the auxiliary plane AP after or before formation of the buried gate regions 140. The top gate region 150 and the lateral channel region 115 may be formed in mesas protruding from the auxiliary plane AP.

The JFET cell TC further includes one or more source regions 110 of the first conductivity type. The source regions 110 directly adjoin the lateral channel region 115 and may be formed as wells extending into the buried gate regions 140. According to the illustrated embodiment, one source region 110 per transistor cell TC extends from the auxiliary plane AP into the buried gate region 140 of the transistor cell TC.

A source electrode 310 directly adjoins the source regions 110 and provides an ohmic contact with the semiconductor body 100. The source electrode 310 is electrically connected with the source regions 110 and may be electrically connected with the buried gate regions 140 to provide an integrated body diode or free-wheeling diode. The source electrode 310 may form or may be electrically connected or coupled to a source terminal S of the semiconductor device 500.

A drain electrode 330 directly adjoins the drain layer 130 and provides an ohmic contact with the drain layer 130 at the second surface 102. The drain electrode 330 may provide or may be electrically connected to a drain terminal D.

A gate electrode 350 directly adjoins the top gate region 150 and provides an ohmic contact with the top gate region 150. The gate electrode 350 may form or may be electrically coupled or connected to a gate terminal G.

A lateral cross-section of the JFET cell TC parallel to the first surface 101, and/or the lateral cross-sections of the top gate region 150 and/or the lateral and vertical channel regions 115, 121 may be stripes, circles, ellipses, polygons, for example hexagons or rectangles with or without rounded corners. A plurality of approximately identical JFET cells TC may be arranged at uniform center-to-center distances (pitches) and may be electrically arranged in parallel.

In the on-state of the JFET transistor cell TC, a load current controlled by a potential at the top gate region 150 flows between the source regions 110 and the drain layer 130 along the lateral direction in the lateral channel region 115 and in substance along the vertical direction in the vertical channel region 121 and the drift zone 120.

The top gate region 150, the lateral channel region 115 and the buried gate region 140 are arranged in this order along the vertical direction.

The lateral channel region 115 includes a super junction structure (compensation structure) including first zones 115a of the first conductivity type and second zones 115b of the second conductivity type. The first and second zones 115a, 115b extend from the top gate region 150 into the lateral channel region 115, wherein a vertical extension of the second zones 115b is smaller than the vertical extension of the lateral channel region 115.

The first and second zones 115a, 115b may extend along a first lateral direction given by the load current direction in the lateral channel region 115 and alternate along a second lateral direction tilted to the first lateral direction. According to an embodiment, the second lateral direction is perpendicular to the first lateral direction. Each first zone 115a is directly connected to both the source region 110 and the vertical channel region 121. Each second zone 115b may be directly connected to the top gate region 150. The first and second zones 115a, 115b may be stripes. According to another embodiment, the first or the second zones 115b may be columns, which may be arranged in lines and rows. For example, the second zones 115b may be columns embedded in a grid-shaped first zone 115a.

A vertical extension v of the lateral channel region 115 may be in the range from 200 nm to 1500 nm, for example from 300 nm to 1000-nm. A pitch of the first zones 115a may be in the range from 50 nm to 50 µm, for example from 100 nm to 500 nm. A ratio of a width w1 of the first zones 115a to a width w2 of the second zones 115b may be in the range from 0.5 to 2, for example 1. A mean impurity concentration in the first zones 115a may be in the range from $5E15$ $cm^{-3}$ to $1E18$ $cm^{-3}$, for example from $5E16$ $cm^{-3}$ to $1E17$ $cm^{-3}$.

The widths of the first and second zones 115a, 115b depend on the semiconductor material and the mean net impurity concentrations and are subject to whether the JFET cell TC is of the normally-on or normally-off type. According to embodiments referring to silicon carbide devices and a mean net impurity concentration in the p-type second zones 115b of about $1E19$ $cm^{-3}$ the mean net impurity concentration in the n-type first zones 115a may be between $1E16$ $cm^{-3}$ and $1E18$ $cm^{-3}$, by way of example, wherein for a mean net impurity concentration in the n-type first zones 115a of $1E16$ $cm^{-3}$ the width w1 of the first zones 115a may be greater 9.5 µm for normally-on devices and at most 8.5 µm for normally-off devices, whereas at a mean net impurity concentration in the first zones 115a of $1E18$ $cm^{-3}$ the width w1 of the first zones 115a may be equal to or greater than 90 nm for normally-on and at most 85 nm for normally-off devices. The net impurity concentrations in the top and buried gate regions 150, 140 may be approximately the same as in the p-type second zones 115b.

The second zones 115b in the lateral channel region 115 may be connected to the top gate region 150, wherein a potential of the second zones 115b follows the gate potential. The first zones 115a are structurally connected to the source regions 110 and a potential of the first zones 115a follows the source potential.

For the following considerations the first conductivity type is the n-type and the second conductivity type is the p-type. Similar considerations apply for embodiments with the first conductivity type being the p-type and the second conductivity type being the n-type.

In the conductive mode of the JFET cell TC the load current flows between the source and vertical channel regions 110, 121 through the first zones 115a. In conventional JFET cells, a vertical extension of a lateral channel region and the impurity concentration in the lateral channel region set the pinch-off voltage at which the JFET cell changes from the conductive to the blocking mode. The vertical extension of the lateral channel region 115 is a function of a growth rate of an epitaxial layer in which the lateral channel region is formed. The epitaxial growth rate has turned out to be difficult to control resulting in fluctuations of the pinch-off voltage among devices obtained from different wafers of a wafer lot.

With the arrangement of the first and second zones 115a, 115b parallel to the current flow in the lateral channel region 121 the pinch-off voltage of the JFET cell TC is no longer defined by the vertical extension of the lateral channel region 115 but by well-controllable parameters such as the lateral dimensions of the first and second zones 115a, 115b and the impurity concentrations in the first and second zones 115a, 115b.

The super junction structure including the first and second zones 115a, 115b decouples the pinch-off voltage of the JFET cell TC from the vertical extension v of the lateral channel region 115. In addition, the pinch-off voltage is not subject to variations of the vertical extension v and lower pinch-off voltages than usual are possible. According to an embodiment the first and second zones 115a, 115b can be defined to provide a normally-off JFET cell TC. Furthermore, for obtaining the same blocking capability the n-type first zones 115a may have a higher impurity concentration than the n-type lateral channel region of a comparative example without super junction structure. The higher impurity concentration results in a lower on-state resistance and reduced static losses.

The JFET cell TC is off as long as depletion zones extending between the first and second zones 115a, 115b do not pinch-off an n-type channel formed by the parallel first zones 115a, wherein the pinch-off voltage is set by the dimensions of and the impurity concentrations in the first and second zones 115a, 115b.

For normally-off JFETs, the width w1 of the first zones 115a is selected to be smaller than the extension of depletion zones along the pn junctions between adjoining first and second zones 115a, 115b when no gate voltage is applied. Applying a gate voltage below the pinch-off voltage decreases the extension of the depletion zones and the n-type channel formed by the parallel first zones 115a opens. The channel allows a lateral current flow through the lateral channel region 115 along an on-state current flow direction between the source region 110 and the vertical channel region 121 and a vertical current flow through the drift zone 120 between the vertical channel 121 and the drain layer 130.

Setting the width w1 of the first zones 115a greater than the width of the depletion zones occurring along the pn junctions between adjoining first and second zones 115a, 115b when no gate voltage is applied, depletes the first and second zones 115a, 115b only partly when no gate voltage is applied and results in a normally-on JFET.

FIG. 1B refers to an embodiment with the first zones 115a forming a matrix and the second zones 115b forming columns embedded in the matrix. The lateral channel region 115 is patterned along both lateral directions.

FIG. 2 refers to an embodiment with the source regions 110 formed at the side of the lateral channel region 115 oriented to the top gate region 150. The source regions 110 may be formed by implants in a layer comprising the lateral channel region 115 or in a layer comprising the top gate region 150. A second gate electrode 340 may directly adjoin and form an ohmic contact with the buried gate regions 140. The second gate electrode 340 may be electrically coupled or connected to a second gate terminal BG, to the source electrode 310 or to another electronic element integrated in the semiconductor device 500. The source region 110 may be formed after the super junction structure and is not subject to implant and etch processes performed for providing the super junction structure. For further details, reference is made to the description of FIG. 1A.

FIGS. 3A to 3F refer to a method of manufacturing a semiconductor device with JFET cells TC including a lateral channel region with a super junction structure.

A first epitaxial layer 120a from a single-crystalline semiconductor material is grown by epitaxy on a single-crystalline pedestal layer 130a, wherein the crystal lattice of the first epitaxial layer 120a grows in registry with the crystal lattice of the pedestal layer 130a. The single-crystalline semiconductor material of the first epitaxial layer 120a may have a band gap of 2.0 eV or higher, such as gallium nitride GaN or silicon carbide SiC. According to an embodiment, the single-crystalline semiconductor material is silicon carbide SiC, for example 2H—SiC, 4H—SiC, 6H—SiC or 15R—SiC. The semiconductor material of the pedestal layer 130a may be the same or another semiconductor material. The pedestal layer 130a as well as the first epitaxial layer 120a have a first conductivity type. The first epitaxial layer 120a may be in-situ doped with impurities of the first conductivity type during the epitaxy.

According to the illustrated embodiments, the first conductivity type is the n-type and the second, opposite conductivity type is the p-type.

A first mask layer from a material impermeable for an implant performed in the following may be deposited on a process surface 101a of the first epitaxial layer 120a opposite to the pedestal layer 130a. The first mask layer is patterned by photolithography to obtain a first implant mask 401 with openings exposing first sections of the process surface 101a. Using the first implant mask 401 impurities of the second impurity type are implanted into the process surface 101a.

FIG. 3A shows a semiconductor substrate 500a with the first epitaxial layer 120a formed on the pedestal layer 130a. The first implant mask 401 exposes a first section and covers a second section of the first epitaxial layer 120a in the cell region of the JFET cell TC. In combination with suitable annealing and diffusion processes, the first implant forms wells of the second conductivity type extending from the first sections of the process surface 101a exposed by the first implant mask 401 into the first epitaxial layer 120a. The wells provide buried gate regions 140. A portion of the first epitaxial layer 120a covered by the first implant mask 401 and directly adjoining the process surface 101a forms a vertical channel region 121. The vertical channel region 121 may be formed in the center of the JFET cell TC or along an edge of the JFET cell TC.

A second implant mask 402 may be formed on the process surface 101a. For example, the first implant mask 401 of FIG. 3A may be removed and a second mask layer may be deposited and patterned by photolithography to form the second implant mask 402. According to another embodiment the first implant mask 401 may be maintained and amended by spacer portions 402a extending along vertical sidewalls of portions of the first implant mask 401. For example, a conformal second mask layer may be deposited that covers the first implant mask 401 and the first sections of the process surface 101a exposed by the first implant mask 401. The conformal second mask layer may be patterned by an anisotropic etch that removes horizontal portions of the second mask layer above the first implant mask 401 and on the process surface 101a.

Impurities of the first conductivity type may be implanted through openings of the second implant mask 402 to form one or two source regions 110 in the JFET cell TC. According to another embodiment, at first the second mask 402 is used to form the source regions 110. Then the first mask 401 for forming the buried gate regions 140 is obtained from the second mask 402 by an isotropic recess.

FIG. 3B shows the second implant mask 402 exposing portions of the buried gate regions 140 spaced from the vertical channel region 121. The source regions 110 are formed as wells extending from the process surface 101a into the buried gate regions 140. A vertical extension of the buried gate regions 140 is greater than a vertical extension of the source regions 110.

The second implant mask 402 is removed and a channel layer 115x is formed by epitaxy on the process surface 101a, wherein the channel layer 115x may be in-situ doped with impurities of the conductivity type of the first epitaxial layer 120a.

FIG. 3C shows the channel layer 115x formed on an auxiliary plane AP corresponding to the process surface 101a of FIG. 3B. The channel layer 115x may be intrinsic or may have the conductivity type of the first epitaxial layer 120a. An exposed surface of the channel layer 115x may form a further process surface of the semiconductor substrate 500a or may correspond to a first surface 101 of a semiconductor body of the finalized semiconductor device.

In the following, the super junction structure is formed in the channel layer 115x. According to an embodiment, a third mask layer may be deposited on the further process surface or the first surface 101 and patterned by photolithography using a dry-etch patterning process. Formation of a third implant mask 403 from the third mask layer may include further recess and/or spacer processes for adjusting the width of openings in the third implant mask 403.

Impurities of the second conductivity type are implanted through the openings in the third implant mask 403 into the channel layer 115x. The implantation energy may be selected such that the implanted impurities do reliably not reach the auxiliary plane AP even under worst case conditions as regards the vertical extension of the channel layer 115x, which is subject to fluctuations due to restricted process control of the epitaxy. To obtain the desired vertical extension of the second zones 115b the implantation may include several implantations at different implantation energies or may use channeling effects of the implanted impurities eventually in combination with suitable diffusion processes.

Figure 3D:
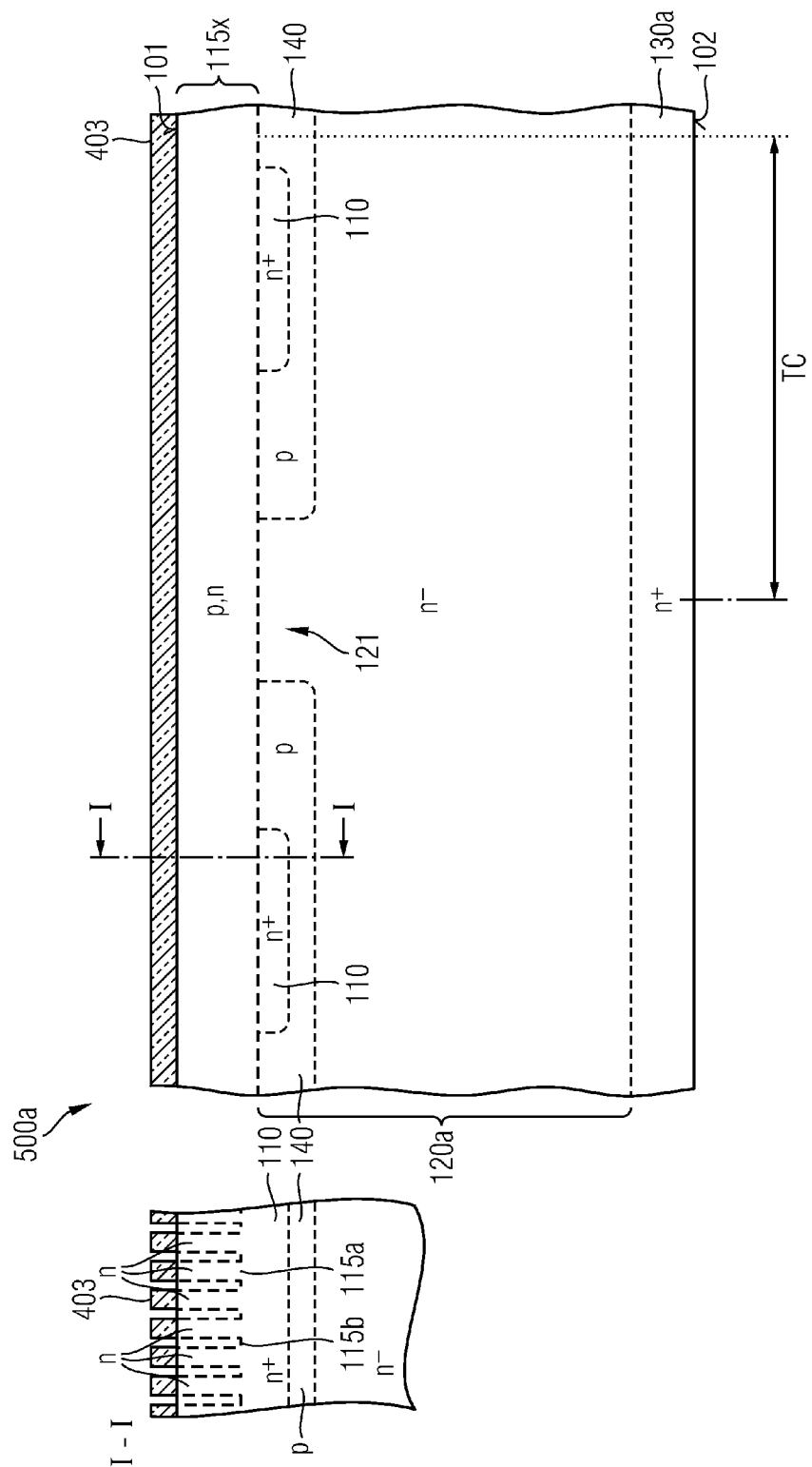
FIG. 3D is a schematic cross-sectional view of the semiconductor substrate portion of FIG. 3C after forming p-type zones of the super junction structure.

FIG. 3D shows the third implant mask 403 disposed on the first surface 101. Openings in the third implant mask 403 run parallel to the cross-sectional plane as indicated in cross-section I-I. The implanted p-type impurities form second zones 115b extending from the first surface 101 into the channel layer 115x. The second zones 115b are formed at a distance to the auxiliary plane AP. Non-implanted zones may be intrinsic or may form n-type first zones 115a of the super junction structure.

A fourth implant mask 404 may be provided, for example by filling the openings of the third implant mask 403 with a second mask material different from a first mask material of the third implant mask 403, removing the third implant mask 403 and, optionally, tuning the openings of the fourth implant mask 404 by spacer and/or recess processes. Openings in the fourth implant mask 404 extend parallel to the cross-sectional plane as indicated in cross-section I-I. N-type impurities may be implanted through the openings in the fourth implant mask 404.

To obtain the desired vertical extension of the first zones 115a the implantation may include several implantations at different implantation energies or may use channeling effects of the implanted impurities eventually in combination with suitable diffusion processes.

Figure 3E:
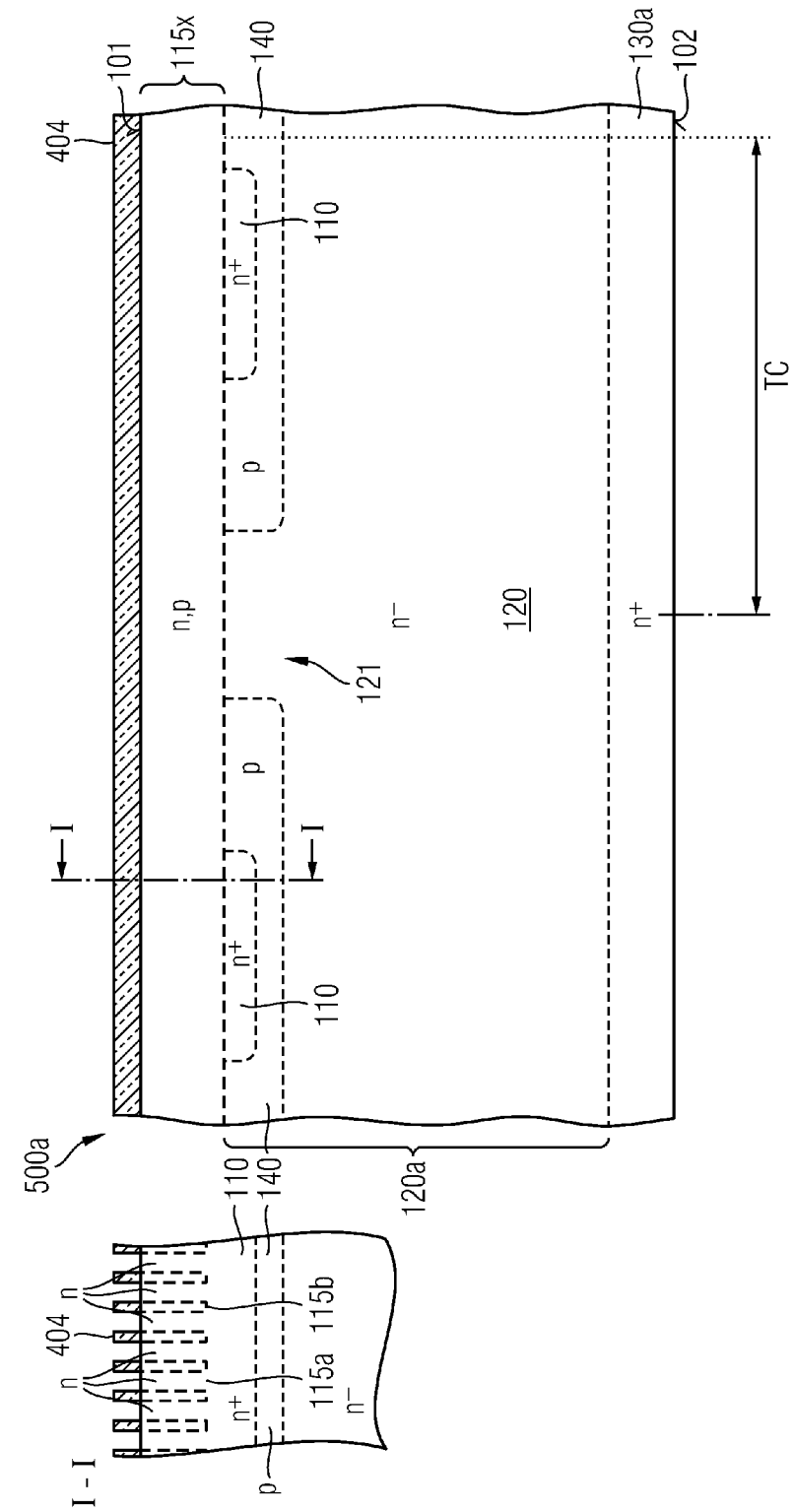
FIG. 3E is a schematic cross-sectional view of the semiconductor substrate portion of FIG. 3D after forming n-type zones of the super junction structure.

FIG. 3E shows the fourth implant mask 404 disposed on the first surface 101 and the first zones 115a resulting from implanting the n-type impurities. The first zones 115a may reach and may extend into the source zones 110.

According to other embodiments, the second implant using the fourth implant mask 404 may be omitted and the first zones 115a are formed from the non-implanted portions of the in-situ doped channel layer 115a of FIG. 3D.

The respective implant mask 403 or 404 is removed and impurities of the second conductivity type may be implanted over the whole cell area of the JFET cell TC to form a top gate region 150. An etch mask may be provided that exposes the top gate region 150 in the vertical projection of portions of the source regions 110 as well as adjoining portions of the buried gate regions 140 and that covers the rest of the top gate region 150. An anisotropic etch may be performed using the etch mask to expose portions of the source regions 110 and the buried gate regions 140 directly adjacent to each other.

FIG. 3F shows mesas including the top gate regions 150 and the lateral channel regions 115 formed from a portion of the channel layer 115x of FIG. 3E, wherein the lateral channel region 115 includes first and second zones 115a, 115b of opposite conductivity type forming a super junction structure. The top gate, source and buried gate regions 150, 110, 140 are exposed and accessible for the formation of ohmic contacts. The pedestal layer 130a includes the drain layer of semiconductor devices obtained from the semiconductor substrate 500a. The not-implanted portion of the first epitaxial layer 120a forms drift zones 120 and vertical channel regions 121 of the JFET cells TC of the singularized semiconductor devices.

Figure 4A:
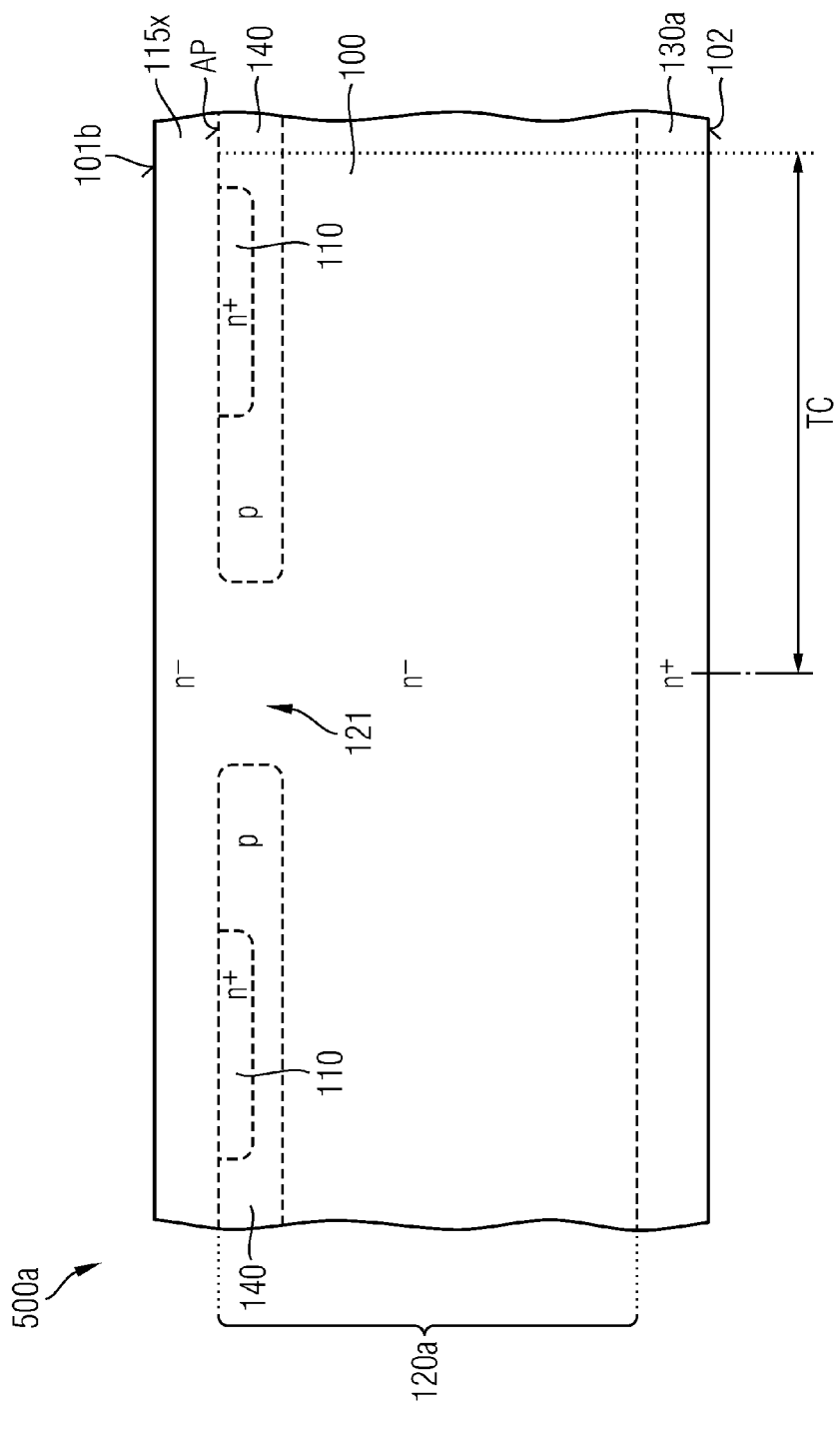
FIG. 4A is a schematic cross-sectional view of a portion of a semiconductor substrate for illustrating another embodiment of a method of manufacturing a semiconductor device with a JFET cell including a lateral channel region with a super junction structure after forming the channel layer.

FIGS. 4A to 4C correspond to a method of forming the super junction structure by etching.

The semiconductor substrate 500a of FIG. 4A corresponds to that of FIG. 3C, wherein the exposed surface of the channel layer 115x forms a further process surface 101b.

An etch mask 430 is provided from an etch mask layer by photolithography, wherein openings in the etch mask 430 may be tuned using recess and spacer processes. Openings in the etch mask 430 run parallel to the cross-sectional plane as indicated in cross-section I-I. An anisotropic etch process is performed using the etch mask 430 to form cavities extending from the further process surface 101b into but not through the channel layer 115x.

FIG. 4B shows the etch mask 430 and the etched cavities extending from the further process surface 101b to a depth less than the auxiliary plane AP. The mesas between the cavities may form the first zones 115a.

The etch mask 430 is removed and a further semiconductor layer, e.g., a second epitaxial layer, is deposited that fills the cavities. The second epitaxial layer is in-situ doped with impurities of the second conductivity type.

FIG. 4C shows the second epitaxial layer filling the cavities and forming a contiguous layer on top of the mesas between the cavities. Portions of the second epitaxial layer in the cavities form the second zones 115b of the super junction structure. Portions of the second epitaxial layer outside the cavities may form at least a portion of the top gate region 150 which may be further processed using further implants, recesses and/or a further epitaxial growth. The process may continue as described with reference to FIG. 3F, by way of example.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
a junction field effect transistor cell comprising a top gate region, a lateral channel region and a buried gate region arranged along a vertical direction,
wherein the lateral channel region comprises first zones of a first conductivity type and second zones of a second conductivity type, the first and second zones alternating along a lateral direction perpendicular to the vertical direction, and the top and buried gate regions have the second conductivity type and the second zones directly adjoin the top gate region.

2. The semiconductor device of claim 1, further comprising:
a source region of the first conductivity type directly adjoining the first zones.

3. The semiconductor device of claim 2, wherein the source region is between the lateral channel region and the buried gate region.

4. The semiconductor device of claim 2, wherein the source region is on a side of the lateral channel region opposite to the buried gate region.

5. The semiconductor device of claim 1, further comprising:
a drift zone of the first conductivity type, the drift zone comprising a vertical channel region directly adjoining the lateral channel region and the first zones.

6. The semiconductor device of claim 5, wherein the buried gate region is between the lateral channel region and the drift zone.

7. The semiconductor device of claim 5, further comprising:
a drain layer of the first conductivity type directly adjoining the drift zone, wherein the drift zone separates the lateral channel region and the buried gate region from the drain layer.

8. The semiconductor device of claim 1, wherein the first and second zones alternate along a second lateral direction perpendicular to a first lateral direction given by an on-state current flow direction in the lateral channel region.

9. The semiconductor device of claim 1, further comprising:
a plurality of the junction field effect transistor cells arranged in a regular pattern.

10. The semiconductor device of claim 1, wherein
the first zones have a first width and the second zones have a second width, and
the first and second widths and impurity concentrations in the first and second zones are set such that the first and second zones are fully depleted in absence of an external voltage applied at the top and buried gate regions.

11. The semiconductor device of claim 1, wherein
the first zones have a first width and the second zones have a second width, and
the first and second widths and impurity concentrations in the first and second zones are set such that the first and second zones are not fully depleted in absence of any external voltage applied at the top and buried gate regions.

12. The semiconductor device of claim 1, wherein the first zones have a lateral center-to-center distance in a range from 50 nm to 1000 nm.

13. The semiconductor device of claim 1, wherein a semiconductor body comprising the top gate region, the lateral channel region, the buried gate region, the drift zone and the drain layer is provided from silicon carbide.

14. A junction field effect transistor, comprising:
a top gate region, a lateral channel region and a buried gate region arranged along a vertical direction,
wherein the lateral channel region comprises first zones of a first conductivity type and second zones of a second conductivity type, the first and second zones alternating along a lateral direction perpendicular to the vertical direction, and the top and buried gate regions have the second conductivity type and the second zones directly adjoin the top gate region.

15. A method of manufacturing a semiconductor device, the method comprising:

forming, in a first section of a process surface of a first epitaxial layer of a first conductivity type, at least one buried gate region of a second conductivity type;

forming, on the process surface, a channel layer;

forming, in the channel layer, first zones of a first conductivity type and second zones of a second conductivity type extending from a surface of the channel layer down to the at least one buried gate region, respectively; and forming a top gate region directly adjoining the first and second zones.

16. The method of claim 15, wherein forming the first and second zones comprises:

providing a first implant mask covering areas for the first zones and comprising openings exposing areas assigned to the second zones; and implanting impurities of the second conductivity type through the openings into the channel layer.

17. The method of claim 16, further comprising:

providing a second implant mask covering the areas for the second zones and comprising openings exposing the areas assigned to the first zones; and implanting impurities of the first conductivity type through the openings into the channel layer.

18. The method of claim 17, wherein the channel layer contains impurities of the first conductivity type and forming the first and second zones comprises:

forming cavities extending into the channel layer; and depositing an in-situ doped layer of a second conductivity type to fill the cavities, wherein the filled cavities provide the second zones and mesas between the cavities form the first zones.

\* \* \* \* \*